(12) United States Patent
Watamura et al.

(10) Patent No.: US 11,281,265 B2
(45) Date of Patent: Mar. 22, 2022

(54) ELECTRONIC DEVICE WITH REDUCED CHASSIS THICKNESS

(71) Applicant: LENOVO (SINGAPORE) PTE. LTD., Singapore (SG)

(72) Inventors: Kenji Watamura, Yokohama (JP); Jun Kaminaga, Tokyo (JP); Hirohide Komiyama, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 153 days.

(21) Appl. No.: 16/701,733

(22) Filed: Dec. 3, 2019

(65) Prior Publication Data

US 2021/0089094 A1 Mar. 25, 2021

(30) Foreign Application Priority Data

Sep. 25, 2019 (JP) .............................. JP2019-173986

(51) Int. Cl.
| | |
|---|---|
| *G06F 1/20* | (2006.01) |
| *H05K 1/02* | (2006.01) |
| *H05K 1/18* | (2006.01) |
| *H05K 7/20* | (2006.01) |
| *G06F 1/16* | (2006.01) |
| *H05K 1/14* | (2006.01) |

(52) U.S. Cl.
CPC .............. *G06F 1/20* (2013.01); *G06F 1/1616* (2013.01); *G06F 1/1662* (2013.01); *H05K 1/0203* (2013.01); *H05K 1/0277* (2013.01); *H05K 1/14* (2013.01); *H05K 1/181* (2013.01); *H05K 7/20136* (2013.01)

(58) Field of Classification Search
CPC ....... G06F 1/20; G06F 1/1662; H05K 1/0203; H05K 1/0277; H05K 1/14; H05K 1/181; H05K 7/20136
See application file for complete search history.

(56) References Cited

U.S. PATENT DOCUMENTS 6,104,451 A * 8/2000 Matsuoka ......... G02F 1/133308
349/58
7,212,404 B2 * 5/2007 Wang .................... H01L 23/427
257/E23.088

(Continued)

FOREIGN PATENT DOCUMENTS

JP 2019032134 A 2/2019

*Primary Examiner* — Rockshana D Chowdhury
*Assistant Examiner* — Douglas R Burtner
(74) *Attorney, Agent, or Firm* — Shimokaji IP

(57) ABSTRACT

An electronic device is provided with a substrate mounted with an electronic component, an expansion card disposed at an interval from the substrate, a flexible printed circuit electrically connecting the substrate and the expansion card, a connector which is provided in the flexible printed circuit and to which a terminal of the expansion card is connected, a cooling unit having a heat transport member thermally connected to the electronic component and a cooling fan cooling the heat transport member, a bracket fixed to the connector, and a chassis housing the substrate, the expansion card, the flexible printed circuit, the connector, the cooling unit, and the bracket, in which the cooling fan is disposed between the substrate and the expansion card and overlaps with the flexible printed circuit in the plan view and the bracket is fixed to the chassis.

12 Claims, 4 Drawing Sheets

(56) References Cited

U.S. PATENT DOCUMENTS

| | | | | |
|---|---|---|---|---|
| 7,363,963 B2* | 4/2008 | Wang | H01L 23/4006 | 165/104.33 |
| 7,515,425 B2* | 4/2009 | Chikazawa | G06F 1/203 | 165/104.33 |
| 7,697,288 B2* | 4/2010 | Okutsu | G06F 1/203 | 361/695 |
| 7,798,823 B2* | 9/2010 | Fujikawa | H05K 1/147 | 439/82 |
| 7,872,877 B2* | 1/2011 | Urano | H05K 5/02 | 361/810 |
| 7,969,728 B2* | 6/2011 | Zheng | H01L 23/467 | 361/679.51 |
| 8,163,413 B2* | 4/2012 | Goto | H01M 50/213 | 429/96 |
| 8,553,398 B2* | 10/2013 | Tatsukami | G06F 1/203 | 361/679.02 |
| 8,553,410 B2* | 10/2013 | Tatsukami | G06F 1/1615 | 361/679.47 |
| 8,848,353 B2* | 9/2014 | Sato | G06F 1/1613 | 361/679.27 |
| 9,104,385 B2* | 8/2015 | Yang | G06F 1/185 | |
| 10,354,356 B2* | 7/2019 | Hu | G06F 1/203 | |
| 10,375,853 B2* | 8/2019 | Aiello | G06F 1/203 | |
| 10,736,218 B1* | 8/2020 | Ganor | H05K 7/20727 | |
| 10,827,652 B2* | 11/2020 | Gupta | H05K 7/20736 | |
| 10,860,112 B1* | 12/2020 | Knoppert | G06F 3/044 | |
| 10,936,073 B1* | 3/2021 | Gajiwala | G06F 3/0414 | |
| 2001/0029128 A1* | 10/2001 | Horiuchi | H01R 13/6315 | 439/578 |
| 2007/0230101 A1* | 10/2007 | Wong | G06F 1/1616 | 361/679.55 |
| 2008/0296134 A1* | 12/2008 | Hattori | G06F 1/1616 | 200/302.1 |
| 2009/0168316 A1* | 7/2009 | Goto | G06F 1/1616 | 361/679.08 |
| 2009/0168383 A1* | 7/2009 | Goto | G06F 1/1658 | 361/790 |
| 2009/0169980 A1* | 7/2009 | Goto | G06F 1/1684 | 429/96 |
| 2010/0053897 A1* | 3/2010 | Kusaka | H01L 23/4006 | 361/697 |
| 2011/0063794 A1* | 3/2011 | Wu | G06F 1/203 | 361/679.47 |
| 2013/0044501 A1* | 2/2013 | Rudisill | F21V 21/35 | 362/398 |
| 2013/0279112 A1* | 10/2013 | Kim | H05K 7/20154 | 361/692 |
| 2014/0022733 A1* | 1/2014 | Lim | H05K 1/0203 | 361/718 |
| 2016/0010649 A1* | 1/2016 | Aiello | G06F 1/203 | 417/423.7 |
| 2016/0380372 A1* | 12/2016 | Hsieh | H01R 13/2442 | 439/676 |
| 2017/0023970 A1* | 1/2017 | Kimura | G06F 1/16 | |
| 2018/0070472 A1* | 3/2018 | Aiello | G06F 1/20 | |
| 2019/0130519 A1* | 5/2019 | Hu | G06F 1/206 | |
| 2019/0306993 A1* | 10/2019 | Kim | B32B 27/281 | |
| 2020/0036821 A1* | 1/2020 | Liu | H04M 1/026 | |
| 2020/0090884 A1* | 3/2020 | Chang | G06F 3/0202 | |
| 2020/0192438 A1* | 6/2020 | Chang | G06F 1/1662 | |
| 2020/0201402 A1* | 6/2020 | Lee | G06F 1/20 | |
| 2020/0384586 A1* | 12/2020 | Kim | H05K 5/03 | |

* cited by examiner

ELECTRONIC DEVICE WITH REDUCED CHASSIS THICKNESS

FIELD OF THE INVENTION

The present invention relates to an electronic device.

BACKGROUND OF THE INVENTION

Conventionally, an electronic device described in Japanese Unexamined Patent Application Publication No. 2019-32134, is known, for example. The electronic device is provided with an electronic substrate mounted with electronic components, such as a CPU (Central Processing Unit) and an SSD (Solid State Drive), a plate-type heat transport device and a cooling fan cooling the electronic components, a battery device, and a chassis housing these members.

SUMMARY OF THE INVENTION

This kind of electronic device has been required to reduce the thickness of the chassis and increase the battery capacity, and thus the layout of the members in the chassis is likely to be limited.

In particular, when expansion cards, such as an SSD and a WWAN (Wireless Wide Area Network), having a large outer shape among the electronic components, i.e., expansion cards conforming to the standards referred to as so-called "M.2" (M dot two) and the like, are connected to a connector disposed on the substrate, it is difficult to reduce the thickness of the chassis and the layout of the members in the chassis is likely to be limited.

In view of the above-described circumstances, it is an object of the present invention to provide an electronic device in which the thickness of a chassis can be reduced and in which members are easily laid out in the chassis.

One aspect of the electronic device of the present invention is provided with a substrate mounted with an electronic component, an expansion card disposed at an interval from the substrate in a plan view in which the substrate surface of the substrate is viewed from the front, a flexible printed circuit electrically connecting the substrate and the expansion card, a connector which is provided in the flexible printed circuit and to which a terminal of the expansion card is connected, a cooling unit having a heat transport member thermally connected to the electronic component and a cooling fan cooling the heat transport member, a bracket fixed to the connector, and a chassis housing the substrate, the expansion card, the flexible printed circuit, the connector, the cooling unit, and the bracket, in which the cooling fan is disposed between the substrate and the expansion card and overlaps with the flexible printed circuit in the plan view and the bracket is fixed to the chassis.

One aspect of the electronic device of the present invention is provided with a substrate mounted with an electronic component, an expansion card disposed at an interval from the substrate in a plan view in which the substrate surface of the substrate is viewed from the front, a flexible printed circuit electrically connecting the substrate and the expansion card, a connector which is provided in the flexible printed circuit and to which a terminal of the expansion card is connected, a bracket fixed to the connector, and a chassis housing the substrate, the expansion card, the flexible printed circuit, the connector, and the bracket, in which the bracket is fixed to the chassis.

One aspect of the electronic device of the present invention is provided with a substrate mounted with an electronic component, an expansion card disposed at an interval from the substrate in a plan view in which the substrate surface of the substrate is viewed from the front, a flexible printed circuit electrically connecting the substrate and the expansion card, a connector which is provided in the flexible printed circuit and to which a terminal of the expansion card is connected, a cooling unit having a heat transport member thermally connected to the electronic component and a cooling fan cooling the heat transport member, and a chassis housing the substrate, the expansion card, the flexible printed circuit, the connector, and the cooling unit, in which the cooling fan is disposed between the substrate and the expansion card and overlaps with the flexible printed circuit in the plan view.

According to the electronic device of one aspect of the present invention, the thickness of the chassis can be reduced and the members are easily laid out in the chassis.

DETAILED DESCRIPTION OF THE INVENTION

Hereinafter, an electronic device 1 of one embodiment of the present invention is described with reference to the drawings.

Figure 1:
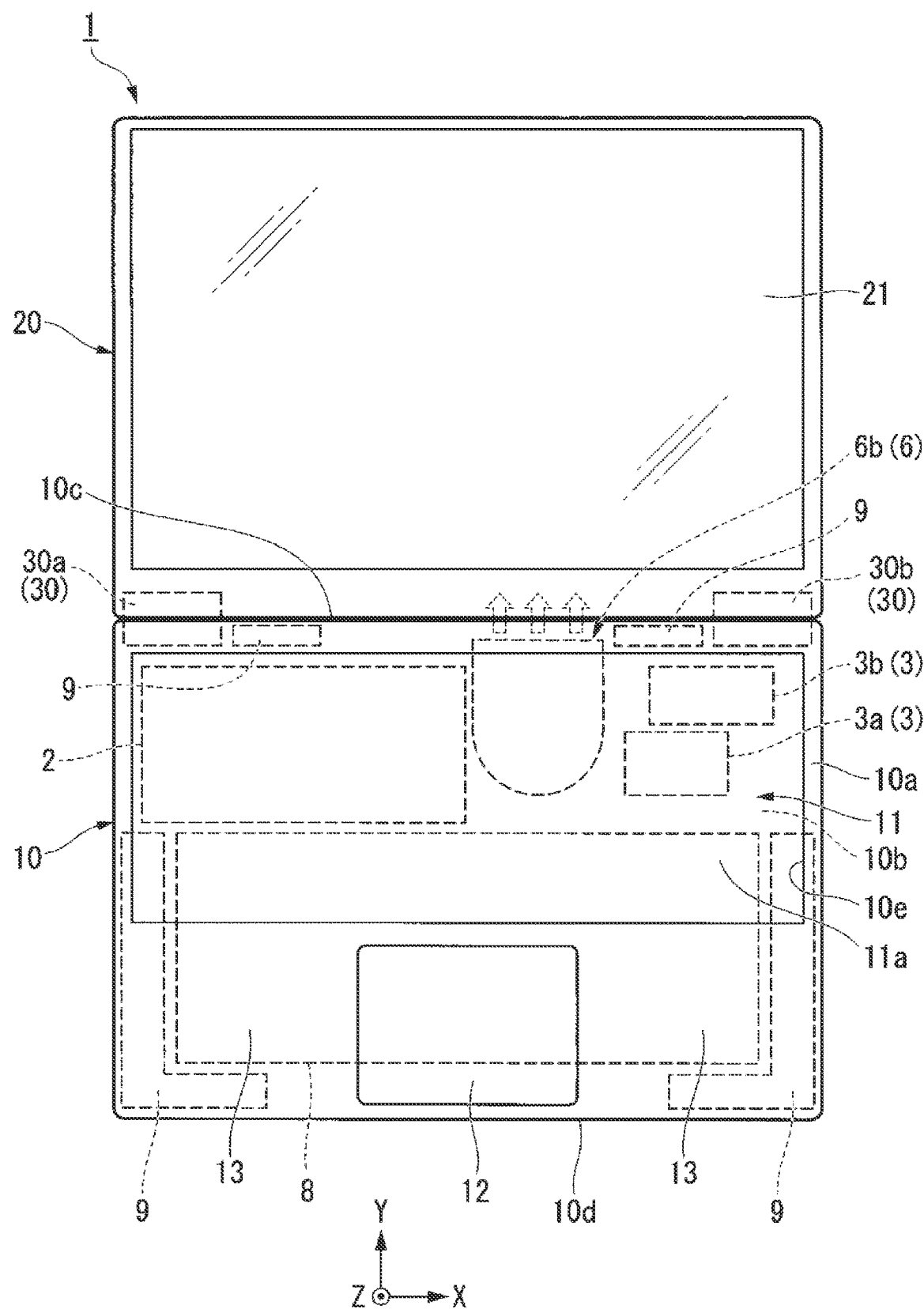
FIG. 1 is a front view illustrating an electronic device of one embodiment of the present invention.

As illustrated in FIG. 1, the electronic device 1 of this embodiment is a so-called clamshell (Laptop) personal computer.

The electronic device 1 is provided with a first chassis 10 equivalent to a chassis of the present invention, a second chassis 20 the side surface of which is rotatably connected to the side surface of the first chassis 10, and hinges 30. The first chassis 10 and the second chassis 20 are rotatably coupled to each other through the hinges 30. The first chassis 10 and the second chassis 20 are relatively movable between a closed state and an opened state around the hinge shafts of the hinges 30. FIG. 1 illustrates a state where the first chassis 10 and the second chassis 20 are opened at an angle of approximately 180° around the hinge shafts of the hinges 30.

The appearance of the first chassis 10 has a square plate shape or a flat rectangular parallelepiped shape. The first chassis 10 has a box shape and has a housing space thereinside. The first chassis 10 has a first cover 10a, a second cover 10b, a keyboard 11, a touchpad 12, and a palm rest portion 13.

The first cover 10a and the second cover 10b configure the front surface and the back surface facing in the thickness direction of the first chassis 10 among the outer surfaces of the first chassis 10. More specifically, the first cover 10a and the second cover 10b face the opposite sides to each other in the thickness direction of the first chassis 10. Specifically, the first cover 10a configures the front surface among the outer surfaces of the first chassis 10. The second cover 10b configures the back surface among the outer surfaces of the first chassis 10. The first chassis 10 has four side surfaces facing in directions orthogonal to the thickness direction among the outer surfaces of the first chassis 10. The four side surfaces connect the front surface and the back surface of the first chassis 10. Each side surface may be included in the first cover 10a or may be included in the second cover 10b.

Although not particularly illustrated, the first cover 10a is opposed to the second chassis 20 in a state where the first chassis 10 and the second chassis 20 are closed at an angle of 0° around the hinge shafts of the hinges 30. In the state where the first chassis 10 and the second chassis 20 are closed at an angle of 0° around the hinge shafts of the hinges 30, the second cover 10b faces in a direction opposite to the second chassis 20.

The appearance of the second chassis 20 has a square plate shape or a flat rectangular parallelepiped shape. The second chassis 20 has a display 21. The display 21 is a liquid crystal display, an organic EL (Electro Luminescence) display, or the like, for example.

A pair of the hinges 30 is provided apart from each other in a direction where the hinge shafts extend. The pair of the hinges 30 has a first hinge 30a and a second hinge 30b.

In this embodiment, the positional relationship of configurations is described by setting an XYZ orthogonal coordinate system. Hereinafter, directions along the X-axis are referred to as horizontal directions, directions along the Y-axis are referred to as forward and backward directions, and directions along the Z-axis are referred to as thickness directions.

The thickness direction is equivalent to the thickness direction of the first chassis 10. A direction from the first cover 10a toward the second cover 10b among the thickness directions is referred to as a back surface side (−Z side) and a direction from the second cover 10b toward the first cover 10a among the thickness directions is referred to as a front surface side (+Z side).

The horizontal direction is a direction parallel to the hinge shafts of the hinges 30 among directions orthogonal to the thickness directions. A direction from the first hinge 30a toward the second hinge 30b among the horizontal directions is referred to as a right side (+X side) and a direction from the second hinge 30b toward the first hinge 30a among the horizontal directions is referred to as a left side (−X side).

The forward and backward direction is a direction orthogonal to the hinge shafts of the hinges 30 among directions orthogonal to the thickness directions. More specifically, the forward and backward direction is a direction orthogonal to the thickness direction and the horizontal direction. As illustrated in FIG. 1, in a plan view of the first chassis 10 in which the first cover 10a is viewed from the front, a first side 10c overlapping with the hinges 30 and a second side 10d parallel to the first side 10c and not overlapping with the hinges 30 among four sides of the outer periphery of the first cover 10a are disposed at positions different from each other in the forward and backward direction. A direction from the first side 10c toward the second side 10d among the forward and backward directions is referred to as a front side (−Y side) and a direction from the second side 10d toward the first side 10c among the forward and backward directions is referred to as a rear side (+Y side).

Figure 2:
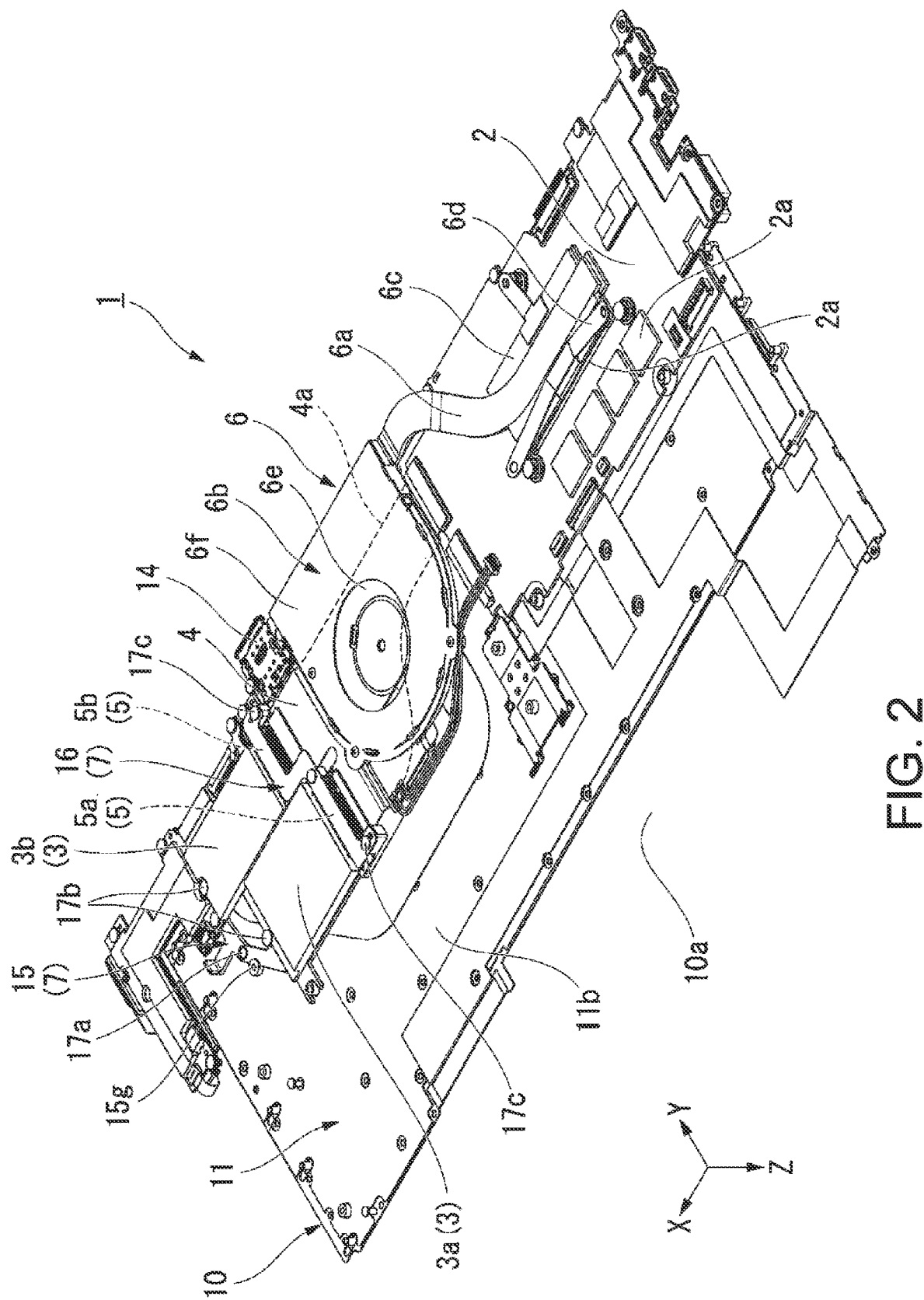
FIG. 2 is a perspective view illustrating a part of the internal structure of the electronic device of one embodiment of the present invention and illustrates a state where the inside of the electronic device is viewed from the back surface side.

The keyboard 11 is one of a plurality of input devices possessed by the electronic device 1. As illustrated in FIG. 1 and FIG. 2, the keyboard 11 has a key 11a and a back plate 11b. FIG. 2 is a perspective view illustrating a part of the internal structure of the electronic device 1 and illustrates a state where the inside of the electronic device 1 is viewed from the back surface side (−Z side).

As illustrated in FIG. 1, the key 11a is disposed in an opening portion 10e of the first cover 10a. The key 11a is a portion exposed to the front surface side (+Z side) through the opening portion 10e of the keyboard 11. In FIG. 1, the illustration of the specific shape of the key 11a is omitted. Two or more of the keys 11a are provided. The two or more keys 11a are arranged in the horizontal direction and the forward and backward direction.

As illustrated in FIG. 2, the back plate 11b has a square plate shape. The back plate 11b is disposed on the back surface side (−Z side) of the two or more keys 11a. The back plate 11b supports the two or more keys 11a.

A touchpad 12 is one of a plurality of input devices possessed by the electronic device 1. As illustrated in FIG. 1, the touchpad 12 is disposed in the first cover 10a and is located on the front side (−Y side) of the keyboard 11.

The palm rest portion 13 is disposed in the first cover 10a. The palm rest portion 13 is located on the front side of the keyboard 11 and one pair of the palm rest portions 13 is provided on the left side and the right side of the touchpad 12.

Figure 3:
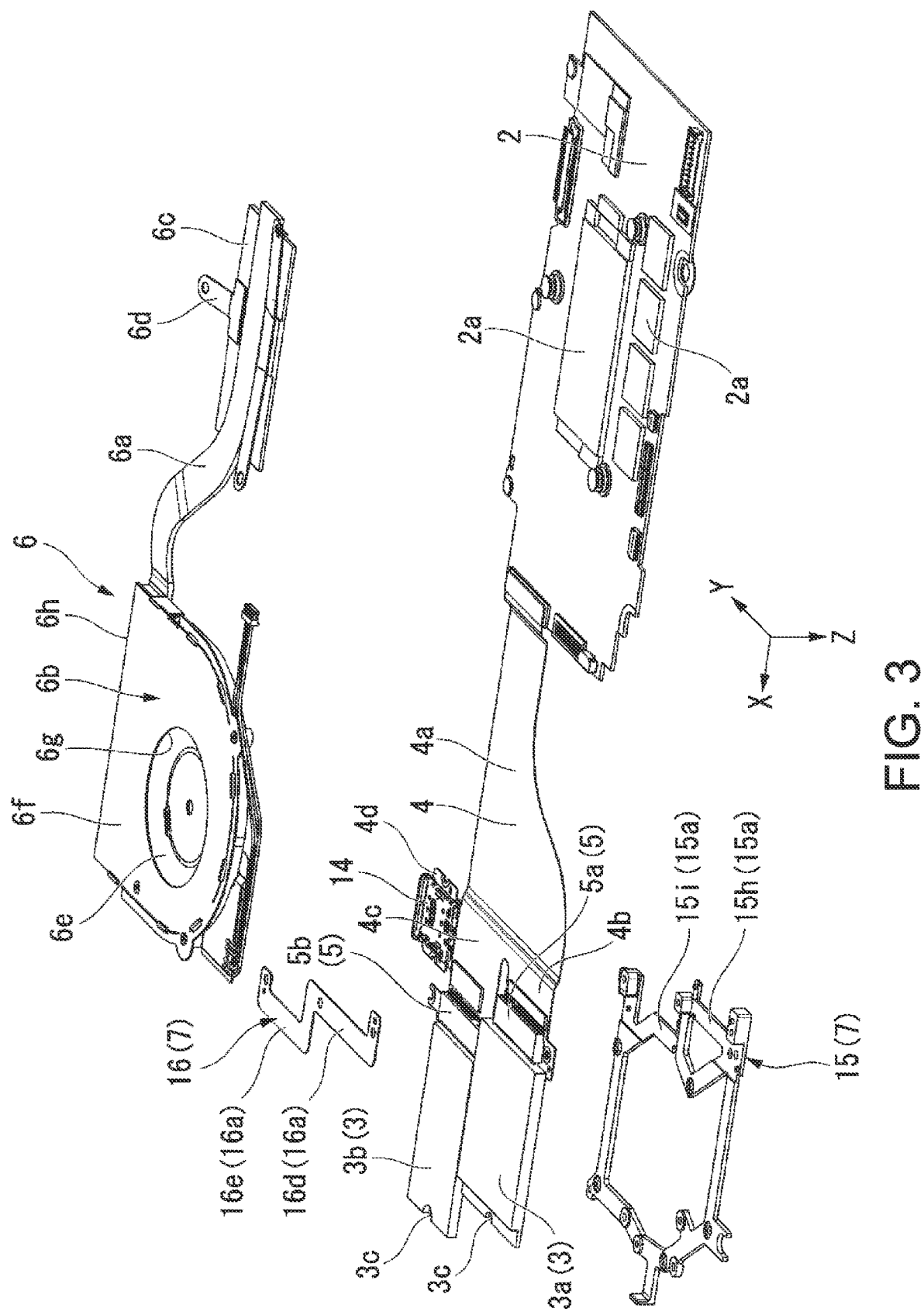
FIG. 3 is an exploded perspective view illustrating a part of the internal structure of the electronic device of one embodiment of the present invention and illustrates a state where the inside of the electronic device is viewed from the back surface side.

As illustrated in FIG. 1 to FIG. 3, the electronic device 1 is provided with a substrate 2, an expansion card 3, a flexible printed circuit (FPC) 4, a connector 5, a cooling unit 6, a bracket 7, a first screw 17a, a second screw 17b, a third screw 17c, a SIMM slot 14, a battery 8, and an antenna 9. In the following explanation, the flexible printed circuit 4 is sometimes simply referred to as an FPC 4. FIG. 3 is an exploded perspective view illustrating a part of the internal structure of the electronic device 1 and illustrates a state where the inside of the electronic device 1 is viewed from the back surface side (−Z side).

The first chassis 10 houses the substrate 2, the expansion card 3, the FPC 4, the connector 5, the cooling unit 6, the bracket 7, the first screw 17a, the second screw 17b, the third screw 17c, the SIMM slot 14, the battery 8, and the antenna 9 thereinside.

The substrate 2 is a motherboard. The substrate 2 has a square plate shape. In the substrate 2, a pair of substrate surfaces faces in the thickness direction (Z-axis direction). As illustrated in FIG. 1, in a plan view in which the substrate surface of the substrate 2 is viewed from the front, the substrate 2 has a rectangular shape in which the length in the horizontal direction (X-axis direction) is larger than the length in the forward and backward direction (Y-axis direction). More specifically, the substrate 2 extends in the horizontal direction. In this plan view, the substrate 2 overlaps with the keyboard 11. As illustrated in FIG. 2, the substrate 2 is provided on the surface facing the back surface side (−Z side) of the back plate 11b.

As illustrated in FIG. 2 and FIG. 3, the substrate 2 has an electronic component 2a. The electronic component 2a is mounted on the substrate 2. The electronic component 2a is disposed at least on the substrate surface facing the back surface side (−Z side) of the substrate 2. Two or more of the electronic components 2a are provided on the substrate 2. The two or more electronic components 2a include a CPU and a memory. The electronic components 2a generate heat by the operation of the electronic device 1. The electronic component 2a may also be referred to as a heat generating component.

The expansion card 3 is an SSD, a WWAN, or the like, for example, and is an internal expansion card conforming to the standard referred to as so-called "M.2" (M dot two). The expansion card has a square plate shape. In the expansion card 3, a pair of plate surfaces faces in the thickness direction (Z-axis direction). The dimension (i.e., height) in the thickness direction of the expansion card 3 is larger than the dimension in the thickness direction of the electronic components 2a.

As illustrated in FIG. 1, the expansion card 3 has a rectangular shape in which the length in the horizontal direction (X-axis direction) is larger than the length in the forward and backward direction (Y-axis direction) in the plan view in which the substrate surface of the substrate 2 is viewed from the front. More specifically, the expansion card 3 extends in the horizontal direction. In the plan view, the expansion card 3 overlaps with the keyboard 11. In the plan view, the expansion card 3 is disposed at an interval from the substrate 2. In this embodiment, the substrate 2 and the expansion card 3 are disposed at an interval from each other in the horizontal direction. As illustrated in FIG. 2, the expansion card 3 is disposed on the back surface side (−Z side) relative to the back plate 11b.

As illustrated in FIG. 3, the expansion card 3 has a terminal (not illustrated) and a fixing portion 3c. The terminal is disposed in an end portion on the left side (−X side) of the expansion card 3. The terminal projects toward the left side from the end portion on the left side of the expansion card 3, for example. Two or more of the terminals are arranged in the forward and backward direction (Y-axis direction).

The fixing portion 3c is disposed in an end portion on the right side (+X side) of the expansion card 3. More specifically, the fixing portion 3c is disposed in the end portion different from the end portion where the terminal is located of both the end portions of the expansion card 3 in a direction where the expansion card 3 extends, i.e., horizontal direction. In this embodiment, the fixing portion 3c has a recessed shape depressed to the left side from the end surface facing the right side of the expansion card 3.

Two or more of the expansion cards 3 are provided. The two or more expansion cards 3 are arranged in the forward and backward direction (Y-axis direction). In this embodiment, two expansion cards 3 are provided. The two or more expansion cards 3 have a first expansion card 3a and a second expansion card 3b. The outer shapes of the first expansion card 3a and the second expansion card 3b are different from each other. In this embodiment, the dimension in the forward and backward direction of the first expansion card 3a located on the front side (−Y side) of the two expansion cards 3a and 3b is larger than the dimension in the forward and backward direction of the second expansion card 3b located on the rear side (+Y side).

In the horizontal direction (X-axis direction), the center position of the first expansion card 3a and the center position of the second expansion card 3b are different from each other. More specifically, the first expansion card 3a and the second expansion card 3b are disposed to be shifted in the horizontal direction. In this embodiment, the center position of the second expansion card 3b is disposed on the right side (+X side) with respect to the center position of the first expansion card 3a in the horizontal direction.

The FPC 4 has a film shape and is deformable while maintaining the electrical characteristics (function). Specifically, the FPC 4 is bendable, i.e., has flexibility. Although not particularly illustrated, the FPC 4 has one or two or more electroconductive layers and a plurality of insulating layers. As illustrated in FIG. 2, the FPC 4 is disposed on the back surface side (−Z side) of the back plate 11b. Although not particularly illustrated, the FPC 4 overlaps with the back plate 11b in a plan view in which the back plate 11b is viewed from the thickness direction (Z-axis direction). More specifically, the FPC 4 overlaps with the keyboard 11 in this plan view. The "plan view in which the back plate 11b is viewed from the thickness direction" is equivalent to the "plan view in which the substrate surface of the substrate 2 is viewed from the front".

As illustrated in FIG. 3, the FPC 4 electrically connects the substrate 2 and the expansion cards 3. One FPC 4 is provided. In this embodiment, the FPC 4 extends in the horizontal direction. In the FPC 4, the dimension in the forward and backward direction (i.e., width) of an end portion on the right side (+X side) connected to the expansion cards 3 of the FPC 4 is larger than the dimension in the forward and backward direction of an end portion on the left side (−X side) connected to the substrate 2 thereof.

In the FPC 4, an intermediate portion 4a located between both the end portions in the horizontal direction of the FPC 4 is located on the front surface side (+Z side) relative to both the end portions in the horizontal direction. More specifically, the intermediate portion 4a swells to the front surface side relative to both the end portions in the horizontal direction of the FPC 4. The intermediate portion 4a is fixed to the surface facing the back surface side (−Z side) of the back plate 11b with a double-sided tape (not illustrated). More specifically, the FPC 4 is fixed to the back plate 11b with a double-sided tape.

Figure 4:
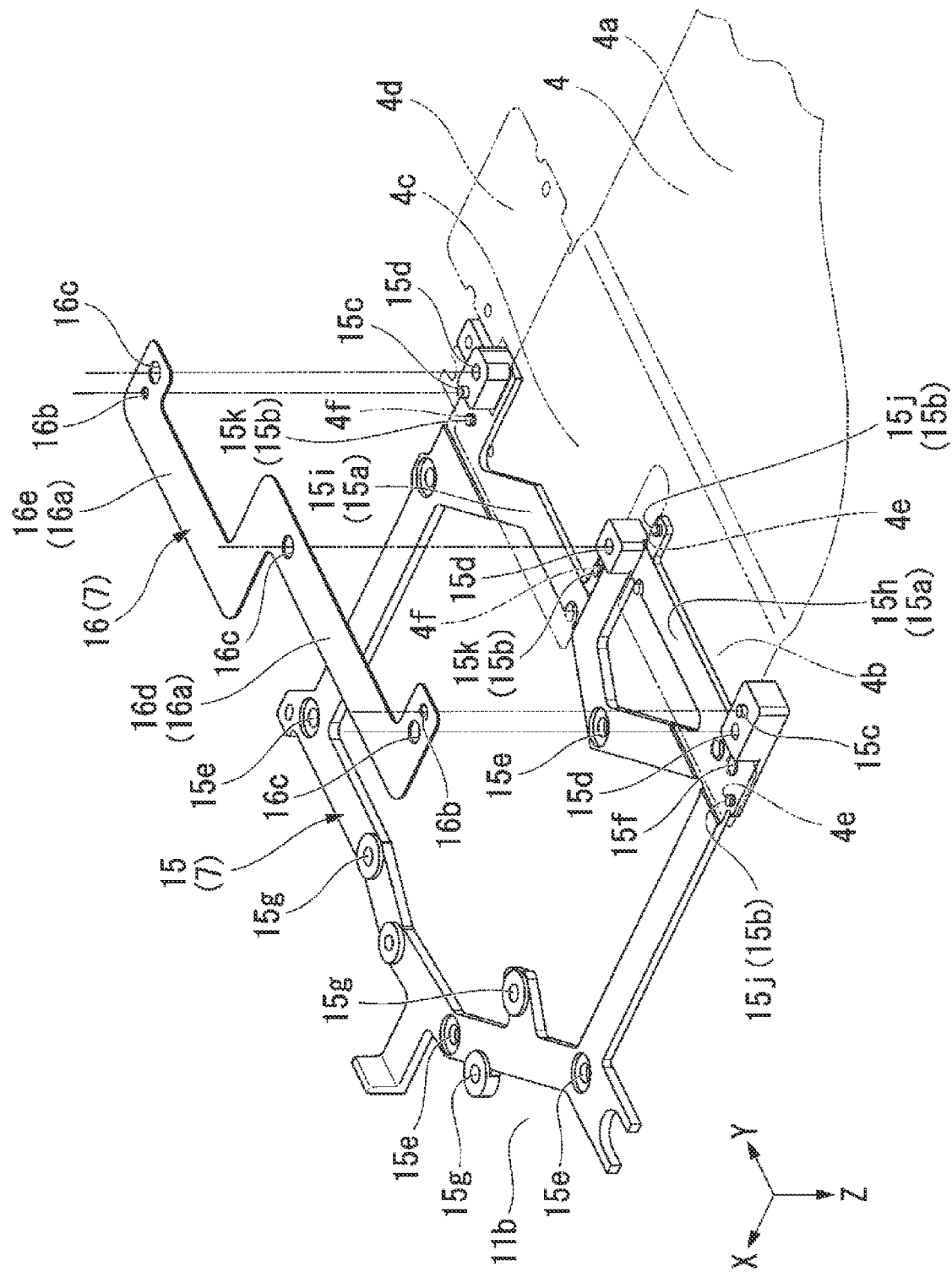
FIG. 4 is an exploded perspective view illustrating a bracket and a part of a flexible printed circuit of the electronic device of one embodiment of the present invention and illustrates a state where the bracket and the flexible printed circuit are viewed from the back surface side.

As illustrated in FIG. 3 and FIG. 4, the FPC 4 has a first connector arrangement portion 4b, a second connector arrangement portion 4c, and a SIMM slot arrangement portion 4d. FIG. 4 is an exploded perspective view illustrating the bracket 7 and a part of the FPC 4 of the electronic device 1 and illustrates a state where the bracket 7 and the FPC 4 are viewed from the back surface side.

The first connector arrangement portion 4b is located in an end portion on the right side (+X side) of the FPC 4. The first connector arrangement portion 4b extends in the horizontal direction (X-axis direction). The first connector arrangement portion 4b is located in a portion on the front side (−Y side) of the end portion on the right side of the FPC 4. In the first connector arrangement portion 4b, a first connector 5a described later of the connector 5 is provided.

The first connector arrangement portion 4b has a first penetration portion 4e. The first penetration portion 4e penetrates the FPC 4 in the thickness direction (Z-axis direction). The first penetration portions 4e is any one of a hole and a notch. Two or more of the first penetration portions 4e are provided. The two or more first penetration portions 4e are disposed at an interval from each other in the forward and backward direction (Y-axis direction), for example.

The second connector arrangement portion 4c is located in the end portion on the right side (+X side) of the FPC 4. The second connector arrangement portion 4c extends in the horizontal direction (X-axis direction). The second connector arrangement portion 4c is located in a portion on the rear side (+Y side) of the end portion on the right side of the FPC 4. In the second connector arrangement portion 4c, a second connector 5b described later of the connector 5 is provided.

The second connector arrangement portion 4c has a second penetration portion 4f. The second penetration portion 4f penetrates the FPC 4 in the thickness direction (Z-axis direction). The second penetration portions 4f is any one of a hole and a notch. Two or more of the second penetration portions 4f are provided. The two or more second penetration portions 4f are disposed at an interval from each other in the forward and backward direction (Y-axis direction), for example.

The SIMM slot arrangement portion 4d is located in the end portion on the right side (+X side) of the FPC 4. In this embodiment, the SIMM slot arrangement portion 4d projects toward the rear side (+Y side) from the second connector arrangement portion 4c.

As illustrated in FIG. 3, the connector 5 is provided in the FPC 4 and terminals of the expansion cards 3 are connected to the connector 5. The FPC 4 electrically connects the expansion cards 3 and the substrate 2 through the connector 5. The connector 5 is disposed in the end portion on the right side (+X side) of the FPC 4. The connector 5 is fixed to the surface facing the back surface side (−Z side) of the FPC 4. The connector 5 is disposed adjacent to the expansion cards 3 on the left side (−X side) of the expansion cards 3.

The connector 5 has a square plate shape. In the connector 5, a pair of plate surfaces faces in the thickness direction (Z-axis direction). In a plan view viewed from the thickness direction, the connector 5 has a rectangular shape in which the length in the forward and backward direction (Y-axis direction) is larger than the length in the horizontal direction (X-axis direction). More specifically, the connector 5 extends in the forward and backward direction.

The connector 5 has a terminal (not illustrated) connectable to the terminals of the expansion cards 3. The terminal of the connector 5 is disposed inside the connector 5 and two or more of the terminals of the connector 5 are arranged in the forward and backward direction.

Two or more of the connectors 5 are provided. More specifically, in this embodiment, a plurality of sets of the expansion card 3 and the connector 5 is provided. One FPC electrically connects the plurality of sets and the substrate 2. The two or more connectors 5 are disposed at positions different from each other in the forward and backward direction (Y-axis direction). In this embodiment, two connectors 5 are provided. The two or more connectors 5 have the first connector 5a and the second connector 5b.

The first connector 5a located on the front side (−Y side) of the two connectors 5a and 5b is disposed in an end portion on the right side (+X side) of the first connector arrangement portion 4b of the FPC 4. The first connector 5a is fixed to the surface facing the back surface side (−Z side) of the first connector arrangement portion 4b. The first connector 5a is disposed adjacent to the first expansion card 3a on the left side (−X side) of the first expansion card 3a. To the first connector 5a, a terminal of the first expansion card 3a is connected.

The second connector 5b located on the rear side (+Y side) of the two connectors 5a and 5b is disposed in an end portion on the right side (+X side) of the second connector arrangement portion 4c of the FPC 4. The second connector 5b is fixed to the surface facing the back surface side (−Z side) of the second connector arrangement portion 4c. The second connector 5b is disposed adjacent to the second expansion card 3b on the left side (−X side) of the second expansion card 3b. To the second connector 5b, a terminal of the second expansion card 3b is connected.

The first connector 5a and the second connector 5b are disposed at positions different from each other in the horizontal direction (X-axis direction). In this embodiment, the second connector 5b is disposed on the right side (+X side) with respect to the first connector 5a.

The cooling unit 6 cools at least the electronic components 2a on the substrate 2. The cooling unit 6 has a heat transport member 6a, a cooling fan 6b, an expansion member 6c, an energization member 6d, and a heat dissipation sheet which is not illustrated.

The heat transport member 6a is thermally connected to the electronic components 2a. The heat transport member 6a is a heat pipe. The heat transport member 6a extends approximately in the horizontal direction (X-axis direction). A portion on the left side (−X side) of the heat transport member 6a contacts the surface facing the back surface side (−Z side) of the electronic components 2a. In this embodiment, the heat transport member 6a contacts at least the CPU among the two or more electronic components 2a.

The cooling fan 6b cools the heat transport member 6a. The cooling fan 6b cools a portion on the right side (+X side) of the heat transport member 6a by an exhaust flow. The exhaust flow of the cooling fan 6b is released to the outside of the first chassis 10 through an exhaust port 6h described later and an exhaust hole (not illustrated) opened to the side surface facing the rear side (+Y side) of the first chassis 10 (see FIG. 1).

As illustrated in FIG. 3, the cooling fan 6b has a fan 6e and a fan casing 6f housing the fan 6e. The fan casing 6f has a suction port 6g and the exhaust port 6h. The suction port 6g is opened to the surface facing the back surface side (−Z side) of the fan casing 6f. The exhaust port 6h is opened to the surface facing the rear side (+Y side) of the fan casing 6f.

The cooling fan 6b is disposed between the substrate 2 and the expansion cards 3 and overlaps with the FPC 4 in the plan view in which the substrate surface of the substrate 2 is viewed from the front, i.e., thickness direction (Z-axis direction). As illustrated in FIG. 1 and FIG. 2, the cooling fan 6b is disposed between the substrate 2 and the expansion cards 3 in the horizontal direction (X-axis direction) in this embodiment. As illustrated in FIG. 2, the cooling fan 6b contacts the surface facing the back surface side (−Z side) of the FPC 4 or is opposed to the surface with a space. In detail, the surface facing the front surface side (+Z side) of the fan casing 6f and the surface facing the back surface side of the intermediate portion 4a of the FPC 4 contact each other in the thickness direction or are opposed to each other with a space.

The expansion member 6c has a plate shape and a pair of plate surfaces faces in the thickness direction (Z-axis direction). The expansion member 6c is provided in a portion on the left side (−X side) of the heat transport member 6a and contacts the surface facing the back surface side (−Z side) of the electronic components 2a. The expansion member 6c is formed of metal, such as copper, for example. The expansion member 6c acts so as to expand a region where the heat transport member 6a receives heat from the electronic components 2a, i.e., heat receiving area of the heat transport member 6a.

The energization member 6d is formed of a plate spring, for example, and is elastically deformable. The energization member 6d energizes the expansion member 6c and the heat transport member 6a toward the electronic components 2a to press the expansion member 6c and the heat transport member 6a against the electronic components 2a. The energization member 6d is fixed to the second cover 10b by screwing, for example.

The heat dissipation sheet (not illustrated) is formed of a graphite sheet, for example. The heat dissipation sheet thermally contacts the substrate 2, the heat transport member 6a, the expansion member 6c, the fan casing 6f, and the expansion cards 3 from the back surface side (−Z side). The heat dissipation sheet receives the heat of the substrate 2, the heat transport member 6a, the expansion member 6c, the fan casing 6f, and the expansion cards 3 and diffuses the heat (heat dissipation) to thereby suppress a temperature rise due to the heat generation of these members.

As illustrated in FIG. 2 and FIG. 3, the brackets 7 sandwich the end portion on the right side (+X side) of the FPC 4 and the connectors 5 between portions (a bottom bracket 15 and a top bracket 16 described later) of the brackets 7 opposed to each other in the thickness direction (Z-axis direction) to fix the same. More specifically, the brackets 7 are fixed to the connectors 5. The brackets 7 are fixed to the first chassis 10. Specifically, the brackets 7 are fixed to the back plate 11b of the keyboard 11.

The brackets 7 have the bottom bracket 15 and the top bracket 16.

The bottom bracket 15 is disposed between the connectors 5 and the back plate 11b and is fixed to the back plate 11b. More specifically, the bottom bracket 15 is disposed between the connectors 5 and the first chassis 10 and is fixed to the first chassis 10.

As illustrated in FIG. 4, the bottom bracket 15 has a frame-like plate shape. A pair of plate surfaces of the bottom bracket 15 faces in the thickness direction (Z-axis direction).

The bottom bracket 15 has a pedestal portion 15a, a positioning portion 15b, a protruding portion 15c, a top bracket fixing portion 15d, a back plate fixing portion 15e, an FPC fixing portion 15f, and an expansion card fixing portion 15g.

The pedestal portion 15a is a portion where a part of the FPC 4 is placed of the bottom bracket 15. The pedestal portion 15a is located in an end portion on the left side (−X side) of the bottom bracket 15. The pedestal portion 15a has a portion extending in the forward and backward direction (Y-axis direction). The surface facing the back surface side (−Z side) of the pedestal portion 15a contacts an end portion on the right side (+X side) of the surface facing the front surface side (+Z side) of the FPC 4.

Two or more of the pedestal portions 15a are provided. The two or more pedestal portions 15a are disposed at positions different from each other in the forward and backward direction (Y-axis direction). In this embodiment, two pedestal portions 15a are provided. The two or more pedestal portions 15a have a first pedestal portion 15h and a second pedestal portion 15i.

The first pedestal portion 15h located on the front side (−Y side) of the two pedestal portions 15a contacts an end portion on the right side (+X side) of the first connector arrangement portion 4b of the FPC 4. As illustrated in FIG. 3, the first connector 5a is supported by the first pedestal portion 15h through the first connector arrangement portion 4b.

As illustrated in FIG. 4, the second pedestal portion 15i located on the rear side (+Y side) of the two pedestal portions 15a contacts an end portion on the right side (+X side) of the second connector arrangement portion 4c of the FPC 4. As illustrated in FIG. 3, the second connector 5b is supported by the second pedestal portion 15i through the second connector arrangement portion 4c.

The first pedestal portion 15h and the second pedestal portion 15i are disposed at positions different from each other in the horizontal direction (X-axis direction). In this embodiment, the second pedestal portion 15i is disposed on the right side (+X side) with respect to the first pedestal portion 15h.

As illustrated in FIG. 4, the positioning portion 15b is provided in the pedestal portion 15a and positions the bottom bracket 15 and the FPC 4. In this embodiment, the positioning portion 15b has a projection shape projecting from the surface facing the back surface side (−Z side) of the pedestal portion 15a. Two or more of the positioning portions 15b are disposed at an interval from each other. The two or more positioning portions 15b have a first positioning portion 15j and a second positioning portion 15k.

The first positioning portion 15j is disposed in the first pedestal portion 15h. Two or more of the first positioning portions 15j are disposed at an interval from each other in the forward and backward direction (Y-axis direction), for example. Each first positioning portion 15j is inserted into each first penetration portion 4e of the first connector arrangement portion 4b. More specifically, the first positioning portions 15j are locked with the first penetration portions 4e.

The second positioning portion 15k is disposed in the second pedestal portion 15i. Two or more of the second positioning portion 15k are disposed at an interval from each other in the forward and backward direction (Y-axis direction), for example. Each second positioning portion 15k is inserted into each second penetration portion 4f of the second connector arrangement portion 4c. More specifically, the second positioning portions 15k are locked with the second penetration portions 4f.

Thus, the FPC 4 is positioned with the bottom bracket 15 in a direction orthogonal to the thickness direction (Z-axis direction).

The protruding portion 15c is disposed in the end portion on the left side (−X side) of the bottom bracket 15. The protruding portion 15c is located in a portion opposed to the top bracket 16 in the thickness direction (Z-axis direction) of the bottom bracket 15. The protruding portion 15c has a projection shape projecting from the surface facing the back surface side (−Z side) of the bottom bracket 15. Two or more of the protruding portions 15c are provided. The two or more protruding portions 15c are disposed at an interval from each other in the forward and backward direction (Y-axis direction), for example.

The top bracket fixing portion 15d is disposed in the end portion on the left side (−X side) of the bottom bracket 15. The top bracket fixing portion 15d is located in a portion opposed to the top bracket 16 in the thickness direction (Z-axis direction) of the bottom bracket 15. The top bracket fixing portion 15d is a recessed portion depressed from the surface facing the back surface side (−Z side) of the bottom bracket 15. In this embodiment, the top bracket fixing portion 15d is a hole penetrating the bottom bracket 15 in the thickness direction. The top bracket fixing portion 15d has a female screw portion in the inner peripheral surface of the top bracket fixing portion 15d. Two or more of the top bracket fixing portions 15d are provided. The two or more top bracket fixing portions 15d are disposed at an interval from each other in the forward and backward direction (Y-axis direction), for example.

The back plate fixing portion 15e is a hole penetrating the bottom bracket 15 in the thickness direction (Z-axis direction). Two or more of the back plate fixing portions 15e are provided. The two or more back plate fixing portions 15e are disposed at an interval from each other in a direction where the outer periphery and the inner periphery of the bottom bracket 15 forming an annular shape extend, i.e., circumferential direction of the bottom bracket 15.

The FPC fixing portion 15f is disposed in the end portion on the left side (−X side) of the bottom bracket 15. The FPC fixing portion 15f is located in a portion opposed to the FPC 4 in the thickness direction (Z-axis direction) of the bottom bracket 15. In this embodiment, the FPC fixing portion 15f is a hole penetrating the bottom bracket 15 in the thickness direction. The FPC fixing portion 15f is opposed to a through-hole, which penetrates the FPC 4 in the thickness direction, in the thickness direction. Screws which are not illustrated are inserted into the through-hole of the FPC 4 and the FPC fixing portion 15f and are screwed to the back plate 11b.

Thus, the FPC 4, the bottom bracket 15, and the back plate 11b are fixed to one another.

The expansion card fixing portion 15g is disposed in the end portion on the right side (+X side) of the bottom bracket 15. Two or more of the expansion card fixing portions 15g are provided. The two or more expansion card fixing portions 15g are disposed at an interval from each other in the forward and backward direction (Y-axis direction). The two or more expansion card fixing portions 15g are disposed at an interval from each other in the horizontal direction (X-axis direction). At least one expansion card fixing portion 15g among the two or more expansion card fixing portions 15g is located in a portion opposed to the expansion card 3 in the thickness direction (Z-axis direction) of the bottom bracket 15. In this embodiment, one expansion card fixing portion 15g is opposed to the fixing portion 3c of the first expansion card 3a in the thickness direction and the other one expansion card fixing portion 15g is opposed to the fixing portion 3c of the second expansion card 3b in the thickness direction. In this embodiment, the expansion card fixing portions 15g are holes penetrating the bottom bracket 15 in the thickness direction. The expansion card fixing portion 15g has a female screw portion in the inner peripheral surface of the expansion card fixing portion 15g.

As illustrated in FIG. 2 to FIG. 4, the top bracket 16 is opposed to the connectors 5 in the thickness direction (Z-axis direction). The top bracket 16 contacts the connectors 5 from the back surface side (−Z side). The top bracket 16 holds the connectors 5 and a part of the FPC 4 between the top bracket 16 and the pedestal portions 15a of the bottom bracket 15. More specifically, the top bracket 16 holds the connectors 5 between the top bracket 16 and the bottom bracket 15.

The top bracket 16 has a plate shape and a pair of plate surfaces faces in the thickness direction (Z-axis direction).

The top bracket 16 has a connector pressing portion 16a, a recessed portion 16b, and a bottom bracket fixing portion 16c.

The connector pressing portion 16a is a portion contacting the connectors 5 and pressing the connectors 5 of the top bracket 16. The connector pressing portion 16a has a portion extending in the forward and backward direction (Y-axis direction). The surface facing the front surface side (+Z side) of the connector pressing portion 16a contacts the surface facing the back surface side (−Z side) of the connector 5.

Two or more of the connector pressing portions 16a are provided. The two or more connector pressing portions 16a are disposed at positions different from each other in the forward and backward direction (Y-axis direction). In this embodiment, two connector pressing portions 16a are provided. The two or more connector pressing portions 16a have a first connector pressing portion 16d and a second connector pressing portion 16e.

The first connector pressing portion 16d located on the front side (−Y side) of the two connector pressing portions 16a contacts the first connector 5a. The first connector 5a and the first connector arrangement portion 4b are sandwiched between the first connector pressing portion 16d and the first pedestal portion 15h in the thickness direction (Z-axis direction).

The second connector pressing portion 16e located on the rear side (+Y side) of the two connector pressing portions 16a contacts the second connector 5b. The second connector 5b and the second connector arrangement portion 4c are sandwiched between the second connector pressing portion 16e and the second pedestal portion 15i in the thickness direction (Z-axis direction).

The first connector pressing portion 16d and the second connector pressing portion 16e are disposed at positions different from each other in the horizontal direction (X-axis direction). In this embodiment, the second connector pressing portion 16e is disposed on the right side (+X side) with respect to the first connector pressing portion 16d.

As illustrated in FIG. 4, the recessed portion 16b is located in a portion opposed to the protruding portion 15c of the bottom bracket 15 in the thickness direction (Z-axis direction) of the top bracket 16. In this embodiment, the recessed portion 16b is a hole penetrating the top bracket 16 in the thickness direction. Two or more of the recessed portions 16b are provided. The two or more recessed portions 16b are disposed at an interval from each other in the forward and backward direction (Y-axis direction), for example. Each protruding portion 15c is inserted into each recessed portion 16b. More specifically, the recessed portions 16b are locked with the protruding portions 15c.

Thus, the top bracket 16 is positioned with the bottom bracket 15 in a direction orthogonal to the thickness direction.

The bottom bracket fixing portion 16c is located in a portion opposed to the top bracket fixing portion 15d of the bottom bracket 15 in the thickness direction (Z-axis direction) of the top bracket 16. The bottom bracket fixing portion 16c is a hole penetrating the top bracket 16 in the thickness direction. Two or more of the bottom bracket fixing portions 16c are provided. The two or more bottom bracket fixing portions 16c are disposed at an interval from each other in the forward and backward direction (Y-axis direction), for example.

As illustrated in FIG. 2, the first screw 17a fixes the bottom bracket 15 to the back plate 11b. Two or more of the first screws 17a are formed. Each first screw 17a is inserted into each back plate fixing portion 15e of the bottom bracket 15 and is screwed into each female screw portion which is not illustrated of the back plate 11b. Thus, the bracket 7 is fixed to the back plate 11b, i.e., first chassis 10.

The second screw 17b fixes the expansion card 3 to the bottom bracket 15. Two or more of the second screws 17b are provided.

Among the two or more second screws 17b, one second screw 17b is inserted into the fixing portion 3c of the first expansion card 3a and is screwed into the female screw portion of the expansion card fixing portion 15g of the bottom bracket 15. The screw tip of the second screw 17b is located inside the expansion card fixing portion 15g in the thickness direction (Z-axis direction). More specifically, the screw tip of the second screw 17b does not reach the back plate 11b.

Among the two or more second screws 17b, the other one second screw 17b is inserted into the fixing portion 3c of the second expansion card 3b and is screwed into the female screw portion of the expansion card fixing portion 15g of the bottom bracket 15. The screw tip of the second screw 17b is also located inside the expansion card fixing portion 15g in the thickness direction (Z-axis direction) and does not reach the back plate 11b.

Thus, the expansion cards 3 are fixed to the bracket 7 in portions other than the terminals of the expansion cards 3.

The third screw 17c fixes the top bracket 16 to the bottom bracket 15. More specifically, the top bracket 16 is fixed to the bottom bracket 15. The third screw 17c fixes the top bracket 16 to the bottom bracket 15 to thereby hold the connectors 5 and a part of the FPC 4 between the top bracket 16 and the bottom bracket 15 to fix the same. Thus, the connectors 5 are fixed to the brackets 7.

Two or more of the third screws 17c are formed. Each third screw 17c is inserted into each bottom bracket fixing portion 16c of the top bracket 16 and is screwed into the female screw portion of each top bracket fixing portion 15d of the bottom bracket 15. The screw tips of the third screws 17c are located inside the top bracket fixing portion 15d in the thickness direction (Z-axis direction). More specifically, the screw tips of the third screws 17c do not reach the back plate 11b.

As illustrated in FIG. 3, the SIMM slot 14 is disposed in the SIMM slot arrangement portion 4d of the FPC 4. The SIMM slot 14 is fixed to the surface facing the back surface side (−Z side) of the SIMM slot arrangement portion 4d.

As illustrated in FIG. 1, the battery 8 is disposed on the front side (−Y side) of the substrate 2, the cooling unit 6, and the expansion cards 3. In this embodiment, the battery 8 is a member having the largest occupied area among a plurality of members housed in the first chassis 10 in the plan view illustrated in FIG. 1.

The antenna 9 is disposed in an outer peripheral portion of the inside of the first chassis 10 and two or more of the antennas 9 are disposed at an interval from each other.

In the electronic device 1 of this embodiment described above, the substrate 2 and the expansion cards 3 are connected by the FPC 4 having a high degree of freedom of shape. Therefore, the substrate 2 and the expansion cards 3 can be individually disposed within the first chassis 10 and the degree of freedom of layout can be increased. Moreover, the expansion cards 3 are connected to the connectors 5 and the connectors 5 are fixed to the first chassis 10 through the brackets 7. Therefore, while the substrate 2 and the expansion cards 3 are connected with the flexible FPC 4, the expansion cards 3 can be stably fixed to the first chassis 10. Moreover, in the plan view in which the substrate surface of the substrate 2 is viewed from the front, the FPC 4 and the cooling fan 6b are disposed in an overlapping manner with each other. Therefore, the space inside the first chassis 10 can be effectively used. Moreover, the use of the FPC 4 can reduce the number of relay connectors provided between the substrate 2 and the expansion cards 3 and connecting the connectors 5 and the substrate 2. As compared with a case where a sub-board mounted with an expansion card and a motherboard (equivalent to the substrate 2 of this embodiment) are connected using a connector and a cable unlike this embodiment, this embodiment can reduce the number of components.

Accordingly, this embodiment can reduce the thickness of the first chassis 10 and facilitates the layout of members in the first chassis 10.

Moreover, the cooling fan 6b is disposed between the substrate 2 and the expansion cards 3, and therefore the distance between the electronic components 2a on the substrate 2 and the cooling fan 6b can be shortened. Thus, the length of the heat transport member 6a can be shortened, so that the cooling capability of the heat transport member 6a is improved and the cooling efficiency of the electronic components 2a is improved. Moreover, the weight of the heat transport member 6a is reduced, so that the weight of the electronic device 1 can be reduced.

In detail, in a case of a configuration in which the substrate 2 and the cooling fan 6b are disposed at an interval from each other and the expansion cards 3 are disposed between these members unlike this embodiment, the distance between the electronic components 2a on the substrate 2 and the cooling fan 6b is lengthened and the length of the heat transport member 6a is also increased. Moreover, the heat transport member 6a is required to bypass the expansion cards 3 having a large outer shape (particularly the thickness is large), so that the length of the heat transport member 6a is further increased and the weight is correspondingly increased. Moreover, in order to secure a space for causing the heat transport member 6a to bypass the expansion cards 3, the outer shape of the first chassis 10 is also increased.

On the other hand, according to this embodiment, the electronic components 2a can be efficiently cooled by shortening the length of the heat transport member 6a, a weight reduction of the electronic device 1 can be achieved by reducing the weight of the heat transport member 6a, and the outer shape of the first chassis 10 is made compact.

Moreover, in this embodiment, the connectors 5 are sandwiched between the bottom bracket 15 fixed to the first chassis 10 and the top bracket 16. Therefore, the connectors 5 and the expansion cards 3 are stably fixed to the first chassis 10 through the brackets 7.

Moreover, in this embodiment, the top bracket 16 is not directly fixed to the back plate 11b, i.e., first chassis 10, and is fixed to the bottom bracket 15. More specifically, although the position where the bottom bracket 15 is fixed to the back plate 11b is likely to be limited due to the layout of the first chassis 10 and the like, for example, the position where the top bracket 16 is fixed to the bottom bracket 15 is hardly limited. Therefore, the position where the top bracket 16 is fixed to the bottom bracket 15 can be relatively freely determined according to each specification (outer shape) of the expansion cards 3 and the connector 5. Moreover, the degree of freedom of shape of each of the bottom bracket 15 and the top bracket 16 is increased, and therefore the expansion cards 3 of various dimensions can be dealt with.

Moreover, in this embodiment, the bottom bracket 15 has the pedestal portions 15a and the positioning portions 15b, and therefore the FPC 4 can be easily set to the bottom bracket 15 in the positioning state in the manufacturing of the electronic device 1. The FPC 4 and the connectors 5 and the brackets 7 are easily assembled.

Moreover, in this embodiment, the expansion cards 3 are fixed to the brackets 7 in portions other than the terminals of the expansion cards 3. More specifically, the expansion cards 3 are fixed to the bottom bracket 15 in portions other than connection portions of the expansion cards 3 and the connectors 5. The expansion cards 3 are fixed to the first chassis 10 at two or more places through the connectors 5 and the brackets 7. Therefore, the attachment attitude to the first chassis 10 of the expansion cards 3 is stabilized. Moreover, the expansion cards 3 are indirectly fixed to the first chassis 10 through the brackets 7 instead of being directly fixed to the first chassis 10, and therefore the fixing positions of the expansion cards 3 and the brackets 7 are hardly limited.

Moreover, in this embodiment, the brackets 7 are fixed to the back plate 11b of the keyboard 11. More specifically, the expansion cards 3 are connected to the connectors 5 and the connectors 5 are fixed to the back plate 11b through the brackets 7. In a plan view viewed from the thickness direction (Z-axis direction), the expansion cards 3, the connectors 5 and the brackets 7, and the keyboard 11 are disposed in an overlapping manner with one another. Among the constituent members of the first chassis 10, the back plate 11b of the keyboard 11 is a member which is likely to be limited in the positions where the brackets 7 are fixed. In this point, the expansion cards 3 are connected to the substrate 2 using the FPC 4, and therefore the expansion cards 3 and the connectors 5 and the brackets 7 can be relatively freely laid out on the back plate 11b in this embodiment.

Therefore, the fixing positions of the brackets 7 and the back plate 11b are easily secured even in the limited layout.

Moreover, in this embodiment, the FPC 4 is fixed to the back plate 11b with a double-sided tape. Therefore, the FPC 4 can be prevented from moving or bending on the back plate 11b. On the fixed FPC 4, the cooling fan 6b can be stably arranged.

Moreover, in this embodiment, the two or more expansion cards 3 are provided, and therefore the performance of the electronic device 1 is improved. As described above, even in a case of the configuration in which the plurality of sets of the expansion card 3 and the connector 5 is provided, the members in the first chassis 10 are easily laid out according to this embodiment.

Moreover, in this embodiment, one FPC 4 connects the plurality of sets of the expansion card 3 and the connector 5 and the substrate 2. As compared with a case where the plurality of sets of the expansion card 3 and the connector 5 and the substrate 2 is separately connected using two or more of the FPCs 4 unlike this embodiment, this embodiment can reduce the number of components, can simplify the structure, and facilitates the assembly.

Moreover, in this embodiment, the two or more expansion card fixing portions 15g are disposed at an interval from each other in the horizontal direction (X-axis direction). According to this embodiment, a case where any one of a plurality of kinds of expansion cards 3 different from each other in the length in the horizontal direction is attached to the bottom bracket 15 can be dealt with the bottom bracket 15 of one type (i.e., shared article), for example.

The present invention is not limited to the embodiments described above and the configuration can be altered without deviating from the gist of the present invention as described below, for example.

Although the embodiments described above give an example in which the positioning portions 15b of the bottom bracket 15 have a projection shape and the first penetration portions 4e and the second penetration portions 4f of the FPC 4 locked with the positioning portions 15b are holes or notches, the present invention is not limited thereto. More specifically, the positioning portions 15b are not limited to the projection shape inserted into the first penetration portions 4e and the second penetration portions 4f.

For example, as illustrated in FIG. 4, the bottom bracket 15 has a block portion of a rectangular parallelepiped shape projecting toward the back surface side (−Z side) in a portion opposed to the top bracket 16 in the thickness direction (Z-axis direction) of the bottom bracket 15. A tongue piece located in the end portion on the right side (+X side) of the FPC 4 and projecting in the forward and backward direction (Y-axis direction) is hooked on the block portion from the right side. Therefore, the block portion is also included in the positioning portion 15b of the bottom bracket 15.

Moreover, the bottom bracket 15 has a step portion projecting toward the back surface side relative to the surface facing the back surface side of the pedestal portion 15a in a portion adjacent to the right side of the pedestal portion 15a of the bottom bracket 15. The step portion faces the left side (−X side) and is opposed to the end surface (edge) facing the right side of the FPC 4. When assembling the FPC 4 and the brackets 7, the positioning can be performed by butting the right end surface of the FPC 4 against the step portion. Therefore, the step portion is also included in the positioning portion 15b of the bottom bracket 15.

Although the embodiments described above describe a Laptop PC (Personal Computer) as an example of the electronic device 1, the present invention is not limited thereto. The electronic device 1 may be a tablet PC or the like, for example.

In addition thereto, the configurations (constituent components) described in the embodiments, modifications, proviso, and the like described above may be combined and the addition, omission, replacement, the other alternations of the configurations can be performed. Moreover, the present invention is not limited by the embodiments and the like described above but is limited by only Claims.

The invention claimed is:

1. An electronic device comprising:
   a substrate on which an electronic component is mounted;
   an expansion card disposed at an interval from the substrate;
   a flexible printed circuit electrically connecting the substrate and the expansion card;
   a connector in the flexible printed circuit and to which a terminal of the expansion card is connected;
   a cooling unit having a heat transport member thermally connected to the electronic component and a cooling fan cooling the heat transport member;
   the entire heat transport member lies only lateral to the cooling fan;
   a bracket fixed to the connector;
   a chassis housing the substrate, the expansion card, the flexible printed circuit, the connector, the cooling unit, and the bracket, wherein
   the cooling fan is between the substrate and the expansion card, and overlaps the flexible printed circuit, and
   the bracket is fixed to the chassis;
   wherein the expansion card is configured to provide an optional capability to the electronic device such that the cooling fan is operable even when the expansion card is disconnected from the connector.

2. The electronic device according to claim 1, wherein the bracket has:
   a bottom bracket between the connector and the chassis, and is fixed to the chassis; and
   a top bracket holds the connector between the top bracket and the bottom bracket.

3. The electronic device according to claim 2, wherein the top bracket is fixed to the bottom bracket.

4. The electronic device according to claim 2, wherein the bottom bracket has:
   a pedestal portion on which a part of the flexible printed circuit is placed; and
   a positioning portion positions the bottom bracket and the flexible printed circuit.

5. The electronic device according to claim 1, wherein the expansion card is fixed to the bracket in a portion other than the terminal of the expansion card.

6. The electronic device according to claim 1, wherein the chassis has a keyboard,
the keyboard has:
   a plurality of keys; and
   a back plate supporting the plurality of keys, and
the bracket is fixed to the back plate.

7. The electronic device according to claim 6, wherein the flexible printed circuit is fixed to the back plate with a double-sided tape.

8. The electronic device according to claim 1, further comprising:
   a plurality of sets of the expansion card and the connector, and which are connected to the flexible printed circuit.

9. The electronic device according to claim 8, wherein
a number of the flexible printed circuit is one, and
the flexible printed circuit electrically connects the plurality of sets and the substrate.

10. The electronic device according to claim 1, wherein the cooling fan is disposed on a same plane as the substrate and the expansion card.

11. An electronic device comprising:
a substrate on which an electronic component is mounted;
an expansion card disposed at an interval from the substrate;
a flexible printed circuit electrically connecting the substrate and the expansion card;
a connector is in the flexible printed circuit and to which a terminal of the expansion card is connected;
a cooling unit having a heat transport member thermally connected to the electronic component, and a cooling fan cooling the heat transport member;
the entire heat transport member lies only lateral to the cooling fan; and
a chassis housing the substrate, the expansion card, the flexible printed circuit, the connector, and the cooling unit, wherein
the cooling fan is between the substrate and the expansion card, and overlaps the flexible printed circuit;
wherein the expansion card is configured to provide an optional capability to the electronic device such that the cooling fan is operable even when the expansion card is disconnected from the connector.

12. The electronic device according to claim 11, wherein the cooling fan is disposed on a same plane as the substrate and the expansion card.

* * * * *